(12) United States Patent
Oh (10) Patent No.: US 11,362,592 B1
(45) Date of Patent: Jun. 14, 2022

(54) AC/DC CONVERTER WITH ACTIVE CAPACITOR BANK

(71) Applicant: Apple Inc., Cupertino, CA (US)

(72) Inventor: Inhwan Oh, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/122,625

(22) Filed: Dec. 15, 2020

(51) Int. Cl.
| | |
|---|---|
| *H02M 3/335* | (2006.01) |
| *H02M 7/219* | (2006.01) |
| *G05F 1/59* | (2006.01) |
| *H02M 1/32* | (2007.01) |
| *G01R 19/165* | (2006.01) |
| *H02M 1/00* | (2006.01) |

(52) U.S. Cl.
CPC .. *H02M 3/33576* (2013.01); *G01R 19/16538* (2013.01); *G05F 1/59* (2013.01); *H02M 1/32* (2013.01); *H02M 7/219* (2013.01); *H02M 1/0003* (2021.05); *H02M 3/33507* (2013.01); *H02M 3/33523* (2013.01); *H02M 3/33561* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,734,562 | A * | 3/1998 | Redl | H02M 1/4208 363/16 |
| 8,624,433 | B2 | 1/2014 | Whitted | |
| 9,263,939 | B2 | 2/2016 | Jin | |
| 9,742,341 | B2 | 8/2017 | Watabu | |
| 9,917,520 | B2 * | 3/2018 | Wu | H02M 1/4258 |
| 10,680,533 | B1 | 6/2020 | Courtney | |
| 2006/0152203 | A1 * | 7/2006 | Perry | H02M 3/33507 323/283 |
| 2007/0046105 | A1 * | 3/2007 | Johnson | H02M 3/33576 307/29 |
| 2012/0256487 | A1 | 10/2012 | Yamada | |

(Continued)

OTHER PUBLICATIONS

Grbovic, Petar J., et al., "A novel three-phase diode boost rectifier using hybrid half-DC-bus-voltage rated boost converter," IEEE Transcations on Industrial Electronics vol. 58, No. 4 (2010): 1316-1329.

(Continued)

*Primary Examiner* — Gary A Nash
(74) *Attorney, Agent, or Firm* — Fletcher Yoder PC (57) ABSTRACT

An AC-DC power converter can include an AC-DC converter stage, such as a flyback converter, configured to receive an AC input voltage and deliver a DC output voltage. The converter can include an active capacitor bank (ACB) coupled to the output of the AC-DC stage. The ACB can include an energy storage capacitor and a plurality of switching devices operable as a bidirectional converter to alternately charge the capacitor from the DC output or discharge the capacitor to maintain output DC voltage regulation. The converter can also include control circuitry responsive to the AC input voltage to selectively: (1) enable the AC-DC stage and operate the switching devices to charge the capacitor from the DC output voltage; (2) and disable the AC-DC stage and operate the switching devices to discharge the capacitor to maintain DC output voltage regulation.

21 Claims, 8 Drawing Sheets

(56) References Cited

U.S. PATENT DOCUMENTS

| | | | |
|---|---|---|---|
| 2013/0201729 A1* | 8/2013 | Ahsanuzzaman | ............................ H02M 3/33507 363/21.12 |
| 2016/0141951 A1* | 5/2016 | Mao | .................... H02M 1/4225 363/21.02 |
| 2017/0126133 A1* | 5/2017 | Yang | ................. H02M 3/33507 |
| 2018/0183348 A1 | 6/2018 | Hu | |
| 2018/0337610 A1* | 11/2018 | Leong | ............... H02M 3/33523 |
| 2019/0356231 A1* | 11/2019 | Radic | ................ H02M 3/33576 |

OTHER PUBLICATIONS

Tsang, Kai-Ming, and Wai-Lok Chan, "Multi-level multi-output single-phase active rectifier using cascaded H-bridge converter," IET Power Electronics vol. 7, Iss. 4 (2014): 784-794.

* cited by examiner

AC/DC CONVERTER WITH ACTIVE CAPACITOR BANK

BACKGROUND

Modern AC-DC converters may be designed and constructed to operate over a wide range of input voltages, so that the same device may be used in different countries having different AC voltage delivery standards. In so-called "low-line" countries, the input AC voltage may be as low as 90V. In "high-line" countries, the input AC voltage may be as high as 265V. This can result in average DC bus voltages ranging from as low as 70V to as high as 375V. Such converters often include a bulk capacitor coupled to the DC bus for energy storage, which must store sufficient energy to allow continued operation of the converter near the zero crossings of the AC waveform. As a result, this DC bulk capacitor must be sized to store sufficient energy under the most adverse line and load conditions. The amount of energy stored in a capacitor is proportional to the capacitance and the square of the voltage thereacross. This results in converters having very large bulk capacitors to be able to provide sufficient energy storage under low-line conditions. This, in turn, results in large physical sizes for the converters.

SUMMARY

In some applications, it may be desirable to reduce the physical size of AC-DC converters as much as practicable. Thus reduction or elimination of the bulk capacitor may be desirable.

An AC-DC converter can include an AC-DC converter stage having an input configured to receive an AC input voltage and an output configured to deliver a DC output voltage, an active capacitor bank coupled to the output of the AC-DC converter stage, and a controller coupled to the AC-DC converter stage and the active capacitor bank. The controller may be configured to compare an AC input voltage to a threshold voltage and, responsive thereto: (1) if the AC input voltage is greater the threshold voltage, enable the AC-DC converter stage and cause the active capacitor bank to charge from the output of the AC-DC converter stage; and (2) if the AC input voltage is less than the threshold voltage, disable the AC-DC converter stage and cause the active capacitor bank to discharge into the output of the AC-DC converter stage.

The active capacitor bank may a buck cell. The buck cell can include a high side switch and a low side switch coupled in series between the output of the AC-DC converter stage and ground and an inductor coupled between a junction of the high side and low side switches and an energy storage capacitor. The controller may be further configured to cause the active capacitor bank to charge from the output of the AC-DC converter stage by operating the high side switch and low side switch as a buck converter to buck the output voltage for storage in the energy storage capacitor. The controller may be further configured to cause the active capacitor bank to discharge into the output of the AC-DC converter stage by operating the high side switch and the low side switch as a boost converter to boost the energy storage capacitor voltage for energy delivery to the output of the AC-DC converter stage.

The active capacitor bank may be a boost cell. The boost cell can include an inductor and a low side switch coupled in series between the output of the AC-DC converter stage and ground and a high side switch coupled between a junction of the inductor and the low side switch and an energy storage capacitor. The controller may be configured to cause the active capacitor bank to charge from the output of the AC-DC converter stage by operating the high side switch and low side switch as a boost converter to boost the output voltage for storage in the energy storage capacitor. The controller may be further configured to cause the active capacitor bank to discharge into the output of the AC-DC converter stage by operating the high side switch and the low side switch as a buck converter to buck the energy storage capacitor voltage for energy delivery to the output of the AC-DC converter stage.

The AC-DC converter stage may be a flyback converter, a primary resonant flyback converter, and/or an active clamp flyback converter.

The controller may be configured to cause the active capacitor bank to charge from the output of the AC-DC converter stage by current mode control of one or more switches of the active capacitor bank. The current mode control includes a current limiting soft start. The controller may be configured to cause the active capacitor bank to discharge into the output of the AC-DC converter stage by voltage mode control of one or more switches of the active capacitor bank.

A method of controlling a power converter having an AC-DC converter stage and an active capacitor bank coupled to an output of the AC-DC converter stage can include comparing an input voltage of the AC-DC converter to a mode selection threshold voltage, and responsive thereto: (1) if the AC input voltage is greater the threshold voltage, enabling the AC-DC converter stage and causing the active capacitor bank to charge from the output of the AC-DC converter stage; and (2) if the AC input voltage is less than the threshold voltage, disabling the AC-DC converter stage and causing the active capacitor bank to discharge into the output of the AC-DC converter stage. Causing the active capacitor bank to charge from the output of the AC-DC converter stage can include operating one or more switches of the active capacitor bank as a buck converter to store energy from the output of the AC-DC converter in an energy storage capacitor. Causing the active capacitor bank to discharge into the output of the AC-DC converter stage can include operating one or more switches of the active capacitor bank as a boost converter to boost the energy storage capacitor voltage for energy delivery to the output of the AC-DC converter stage. Causing the active capacitor bank to charge from the output of the AC-DC converter stage can include operating one or more switches of the active capacitor bank as a boost converter to store energy from the output of the AC-DC converter in an energy storage capacitor. Causing the active capacitor bank to discharge into the output of the AC-DC converter stage can include operating one or more switches of the active capacitor bank as a buck converter to buck the energy storage capacitor voltage for energy delivery to the output of the AC-DC converter stage. Causing the active capacitor bank to charge from the output of the AC-DC converter stage can include current mode control of one or more switches of the active capacitor bank. Causing the active capacitor bank to discharge into the output of the AC-DC converter stage can include voltage mode control of one or more switches of the active capacitor bank. The current mode control can include a soft start current limit.

An AC-DC power converter can include an AC-DC converter stage, such as a flyback converter, configured to receive an AC input voltage and deliver a DC output voltage. The converter can include an active capacitor bank (ACB)

coupled to the output of the AC-DC stage. The ACB can include an energy storage capacitor and a plurality of switching devices operable as a bidirectional converter to alternately charge the capacitor from the DC output or discharge the capacitor to maintain output DC voltage regulation. The converter can also include control circuitry responsive to the AC input voltage to selectively: (1) enable the AC-DC stage and operate the switching devices to charge the capacitor from the DC output voltage; (2) and disable the AC-DC stage and operate the switching devices to discharge the capacitor to maintain DC output voltage regulation.

DETAILED DESCRIPTION

In the following description, for purposes of explanation, numerous specific details are set forth to provide a thorough understanding of the disclosed concepts. As part of this description, some of this disclosure's drawings represent structures and devices in block diagram form for sake of simplicity. In the interest of clarity, not all features of an actual implementation are described in this disclosure. Moreover, the language used in this disclosure has been selected for readability and instructional purposes, has not been selected to delineate or circumscribe the disclosed subject matter. Rather the appended claims are intended for such purpose.

Various embodiments of the disclosed concepts are illustrated by way of example and not by way of limitation in the accompanying drawings in which like references indicate similar elements. For simplicity and clarity of illustration, where appropriate, reference numerals have been repeated among the different figures to indicate corresponding or analogous elements. In addition, numerous specific details are set forth in order to provide a thorough understanding of the implementations described herein. In other instances, methods, procedures and components have not been described in detail so as not to obscure the related relevant function being described. References to "an," "one," or "another" embodiment in this disclosure are not necessarily to the same or different embodiment, and they mean at least one. A given figure may be used to illustrate the features of more than one embodiment, or more than one species of the disclosure, and not all elements in the figure may be required for a given embodiment or species. A reference number, when provided in a given drawing, refers to the same element throughout the several drawings, though it may not be repeated in every drawing. The drawings are not to scale unless otherwise indicated, and the proportions of certain parts may be exaggerated to better illustrate details and features of the present disclosure.

Figure 1:
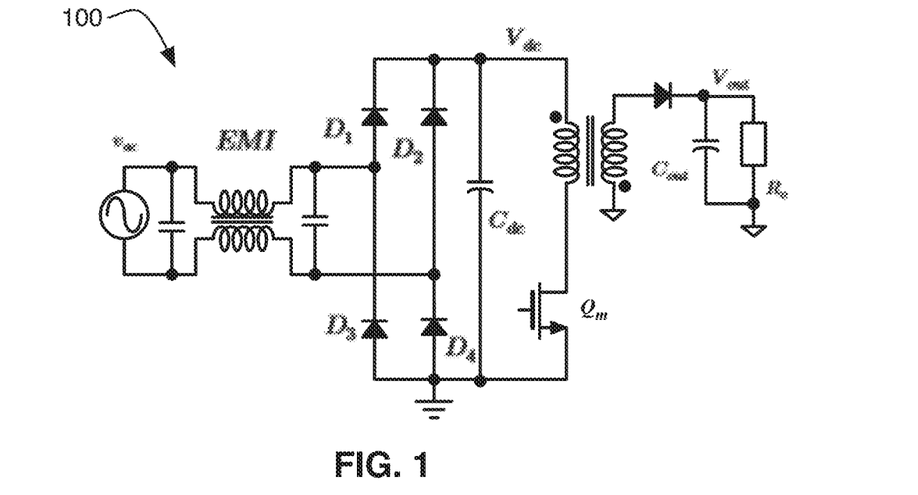
FIG. 1 illustrates an exemplary AC-DC converter based on a flyback topology.

FIG. 1 illustrates an exemplary AC-DC converter based on a flyback topology. An input AC voltage VAC is coupled an optional electromagnetic interference filter EMI. The filtered AC voltage is coupled to the input of a rectifier, in the illustrated example a full bridge rectifier made up of diodes D1-D4. This results in a full-wave rectified voltage appearing across the DC voltage bus VDC. A bulk capacitor CDC provides energy storage that can provide energy for operation of the converter when the AC voltage is near its zero-crossings, at which point the full wave rectified voltage appearing across the DC bus will also be near-zero. Flyback switch Qm may be alternately opened and closed to achieve voltage conversion. When flyback switch Qm is closed, a linearly increasing DC current flows through the primary winding of the flyback transformer, storing energy therein. When flyback switch is opened, the voltage across the primary winding (and therefore the coupled secondary winding) reverses polarity, causing the energy stored in the flyback transformer to be delivered to the output via the rectifier. Control of the switching frequency and/or duty cycle of main switch Qm may be used to regulate the output voltage. Additionally, an output filter capacitor Cout may be provided to smooth the output voltage. The illustrated topology is but one example, and AC-DC converters may be constructed based on other converter topologies.

Modern AC-DC converters may be designed and constructed to operate over a wide range of input voltages, so that the same device may be used in different countries having different AC voltage delivery standards. In so-called "low-line" countries, the input AC voltage may be as low as 90V. In "high-line" countries, the input AC voltage may be as high as 265V. This can result in average DC bus voltages ranging from as low as 70V to as high as 370V. Because bulk capacitor CDC must store sufficient energy to allow continued operation of the converter near the zero crossings of the AC waveform, it must be sized to store sufficient energy under the most adverse line and load conditions. The amount of energy stored in a capacitor is proportional to the capacitance and the square of the voltage. This results in converters having very large bulk capacitors, to be able to provide sufficient energy storage under low-line conditions. This, in turn, results in large physical sizes for the converters. In many applications, it is desirable to reduce the physical size of AC-DC converters as much as practicable, and thus reduction or elimination of the bulk capacitor may be desirable.

Figure 2:
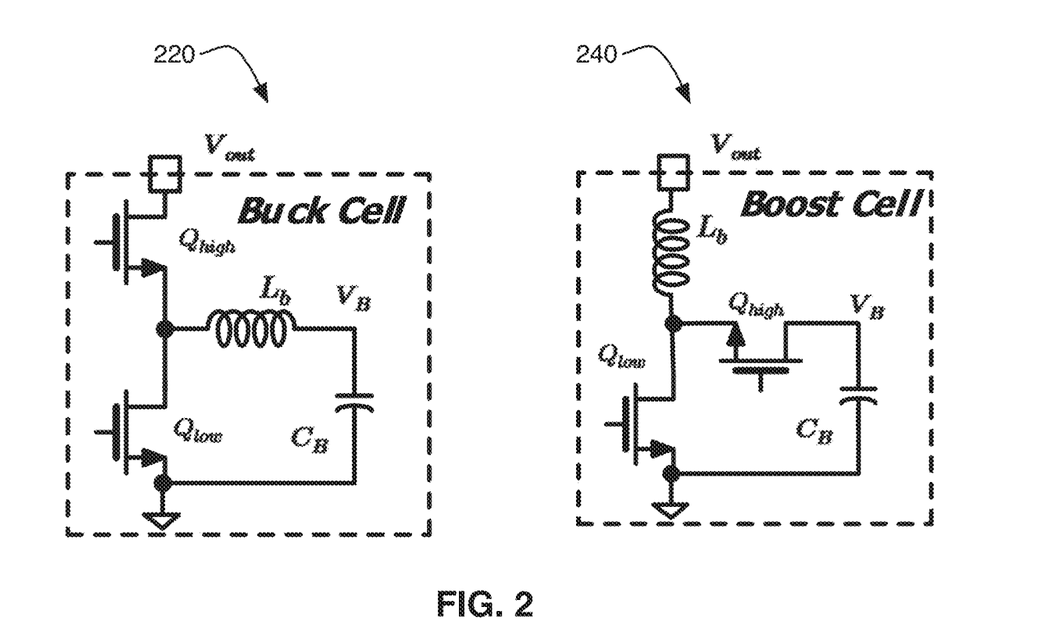
FIG. 2 illustrates two alternative active capacitor bank circuits that may be coupled to the output of an AC-DC converter to allow for reduction or elimination of the DC bulk capacitor.

FIG. 2 illustrates two alternative active capacitor bank circuits 220, 240 that may be coupled to the output of an AC-DC converter as described in greater detail below to allow for elimination of the DC bulk capacitor. Active capacitor bank 220 is a buck cell, which may, during certain modes of operation, charge the storage capacitor CB from the output voltage of AC-DC converter. To achieve this mode of operation, switch Qlow is switched complimentarily to or opposite of Qhigh and switch Qhigh is switched with a controlled variable duty cycle using current mode control as a buck converter. As a result, Qhigh becomes the switch of a buck converter, and Qlow acts as a synchronous rectifier or the diode of a buck converter, with inductor Lb serving as the buck element, and capacitor CB as output load.

During other modes of operation, active capacitor bank/buck cell 220 may boost the voltage across the capacitor CB to help maintain the output voltage. To achieve this mode of operation, switch Qhigh may be turned off or switched complementarily to or opposite of Qlow and switch Qlow may be switched with duty cycle control using voltage mode control as a boost converter. As a result, Qlow become the main switch of a boost converter with duty cycle control, and Qhigh acts as the synchronous rectifier or diode of a boost converter, with inductor Lb serving as the boost element, and capacitor CB as the energy storage element.

Similarly, active capacitor bank 240 is a boost cell, which may, during certain modes of operation, boost the output voltage Vout of the AC-DC converter for storage in storage capacitor CB. To achieve this mode of operation, switch Qhigh may be turned off or switched complementarily to Qlow and switch Qlow may be switched with duty cycle control using current mode control as a boost converter. As a result, Qlow becomes the switch of a boost converter, and Qhigh acts as the diode or synchronous rectifier of a boost converter, with inductor Lb serving as the boost element, and capacitor CB as the output load.

During other modes of operation, active capacitor bank/boost cell 240 may buck the voltage across the capacitor CB to help maintain the output voltage. To achieve this mode of operation, switch Qlow is disabled or switched complementarily to Qhigh and switch Qhigh is switched with duty cycle control using voltage mode control as a buck converter to produce the output voltage Vout. As a result, Qhigh becomes the main duty cycle controlled switch of a buck converter, and Qlow acts as the synchronous rectifier or diode of a buck converter, with inductor Lb serving as the buck element, and capacitor CB as the input.

Thus, each of the active capacitor bank circuits 220, 240 comprise a bi-directional buck-boost (or boost-buck) converter and an energy storage capacitor, operation of which are described in greater detail below.

Figure 3A:
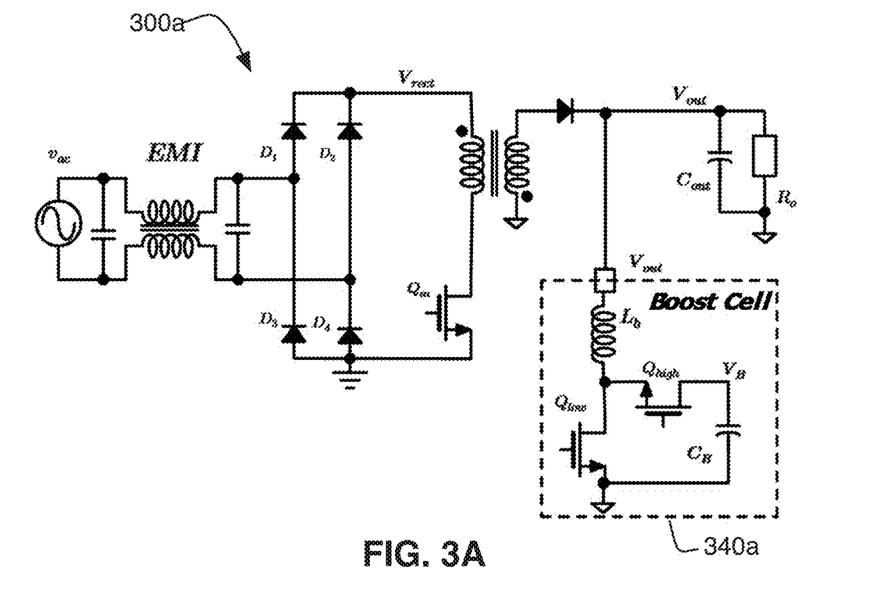
FIGS. 3A-3C illustrate AC-DC converters incorporating boost cell active capacitor banks.
Figure 3B:
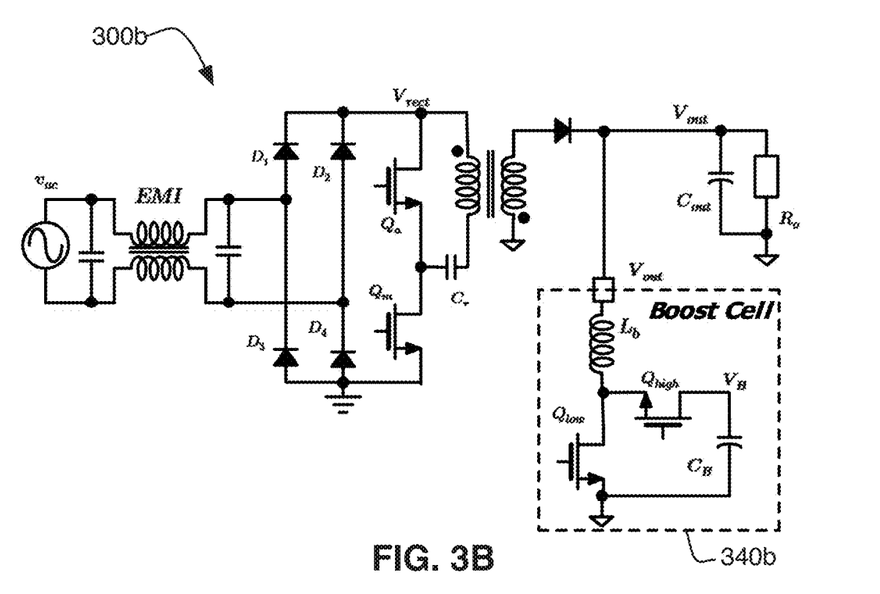
Figure 3C:
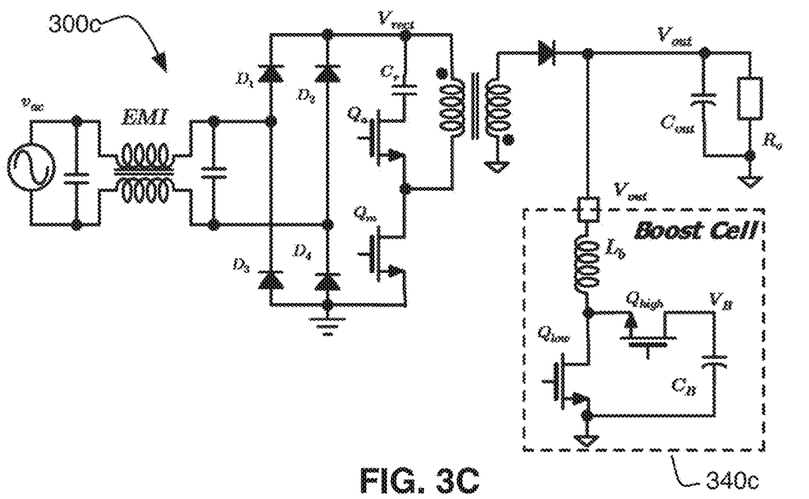

FIGS. 3A-3C illustrate AC-DC converters 300a-300c incorporating boost cells 340a-340c. FIG. 3A illustrates a conventional flyback converter 300a incorporating a boost cell 340a coupled to its output. Flyback converter 300a may operate substantially as described above with respect to FIGS. 1 and 2. Namely, when the rectified AC input voltage Vrect is high enough, flyback switch Qm may be alternately operated to store energy in the flyback transformer and deliver energy to the output. During this mode of operation, the switches of boost cell 340a may be operated as a boost converter to store energy in energy storage capacitor CB, which (by virtue of the boost operation) has a voltage greater than the output voltage. Conversely, when the rectified AC input voltage Vrect is not high enough, the flyback converter may be disabled. During this mode of operation, the switches of boost cell 340a may be operated as a buck converter to reduce the voltage across energy storage capacitor CB to the output voltage, thereby delivering energy from energy storage capacitor CB to the output. Presence of the active capacitor bank/boost cell 340a allows for elimination of the DC bulk capacitor on the input side of the flyback converter. Further details of this operation are described below with reference to FIGS. 4 and 5.

FIG. 3B illustrates a primary resonant flyback converter 300b incorporating a boost cell 340b coupled to its output. Primary resonant flyback converter includes main switch Qm, generally corresponding to flyback switch Qm discussed above. The primary resonant flyback converter also includes a resonant capacitor Cr and an auxiliary switch Qa. Auxiliary switch Qa may be operated essentially complementarily with respect to main switch Qm, such that when Qm is closed, Qa is opened and vice versa. This switching combined with associated resonance between resonant capacitor Cr and the primary winding of the flyback transformer can provide for enhanced operation of the flyback converter by facilitating zero voltage switching and otherwise increasing efficiency.

Otherwise, flyback converter 300b may operate generally as described above with respect to FIGS. 1, 2, and 3A. Namely, when the rectified AC input voltage Vrect is high enough, flyback switch Qm may be alternately operated to store energy in the flyback transformer and deliver energy to the output. During this mode of operation, the switches of boost cell 340b may be operated as a boost converter to store energy in energy storage capacitor CB, which (by virtue of the boost operation) has a voltage greater than the output voltage. Conversely, when the rectified AC input voltage Vrect is not high enough, the flyback converter may be disabled. During this mode of operation, the switches of boost cell 340b may be operated as a buck converter to reduce the voltage across energy storage capacitor CB to the output voltage, thereby delivering energy from energy storage capacitor CB to the output. Presence of the active capacitor bank/boost cell 340b allows for elimination of the DC bulk capacitor on the input side of the flyback converter. Further details of this operation are described below with reference to FIGS. 4 and 5.

FIG. 3C illustrates a flyback converter 300c with a resonant active clamp incorporating a boost cell 340c coupled to its output. The active clamp resonant flyback converter includes main switch Qm, generally corresponding to flyback switch Qm discussed above. The active clamp resonant flyback converter also includes a clamp capacitor Cr and an auxiliary switch Qa. Auxiliary switch Qa may be operated essentially complementarily with respect to main switch Qm, such that when Qm is closed, Qa is opened and vice versa. This switching can allow leakage energy stored in the flyback transformer that would otherwise be lost to be recovered and reused.

Otherwise, flyback converter 300c may operate generally as described above with respect to FIGS. 1, 2, 3A, and 3B. Namely, when the rectified AC input voltage Vrect is high enough, flyback switch Qm may be alternately operated to store energy in the flyback transformer and deliver energy to the output. During this mode of operation, the switches of boost cell 340c may be operated as a boost converter to store energy in energy storage capacitor CB, which, by virtue of the boost operation, has a voltage greater than the output voltage. Conversely, when the rectified AC input voltage Vrect is not high enough, the flyback converter may be disabled. During this mode of operation, the switches of boost cell 340c may be operated as a buck converter to reduce the voltage across energy storage capacitor CB to the output voltage, thereby delivering energy from energy storage capacitor CB to the output. Presence of the active capacitor bank/boost cell 340c allows for elimination of the DC bulk capacitor on the input side of the flyback converter. Further details of this operation are described below with reference to FIGS. 4 and 5.

Figure 4:
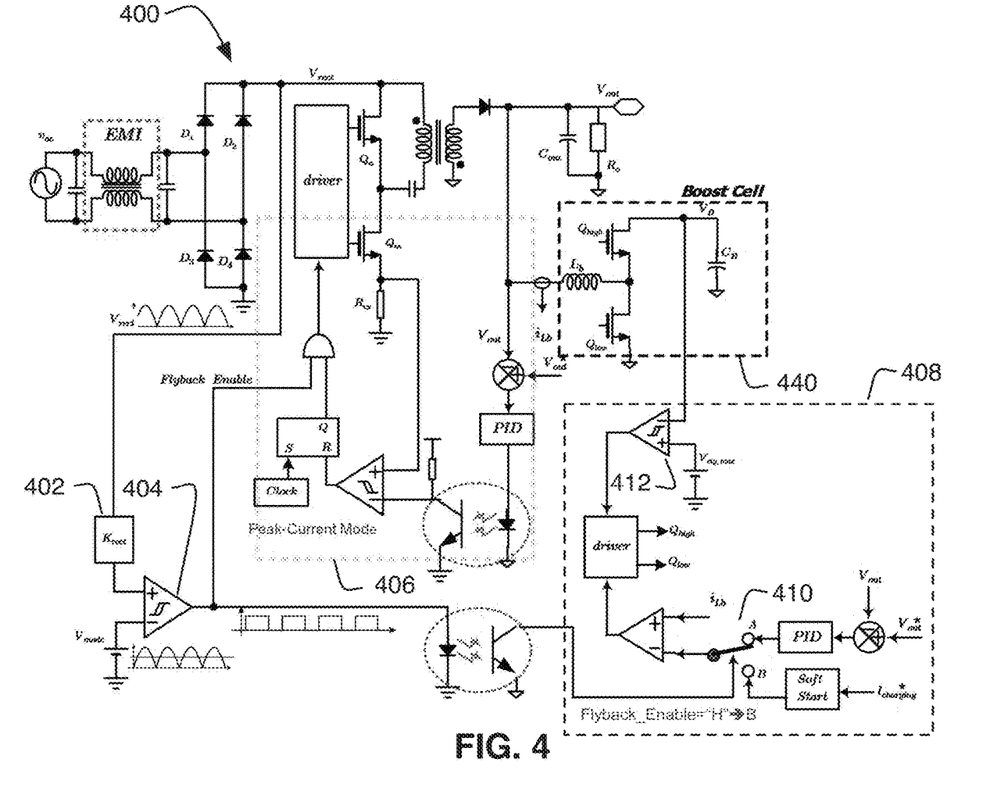
FIG. 4 illustrates an AC-DC converter incorporating a boost cell active capacitor bank with a block diagram of an exemplary control system.

FIG. 4 illustrates an AC-DC converter 400 incorporating a boost cell active capacitor bank/boost cell 440 coupled to its output, together with a block diagram of an exemplary control system. AC-DC converter 400 is illustrated as a primary resonant flyback converter, like that described above with respect to FIG. 3B, though any other flyback topology—or, indeed—any other AC-DC topology could also be used. The control system receives as an input the rectified input voltage Vrect appearing across the DC bus. This rectified input voltage may pass through an optional gain element 402 before being delivered to a comparator 404. Comparator 404 may receive at its other input a predetermined threshold voltage Vmode that determines the operating mode of converter 400. When the instantaneous value of Vrect exceeds the Vmode threshold, the output of comparator 404 will be high. This high signal may be delivered as a flyback enable signal to flyback controller 406. In the illustrated embodiment, flyback controller 406 is a "peak current mode" controller. The remaining components of controller 406 are thus typical of conventional peak current controllers for flyback converters, which are understood by those skilled in the art and will not be discussed in further detail herein. These components could be substituted with other circuitry having equivalent or similar functionality, including analog circuits, digital circuits, programmable controllers, etc. Indeed, other controller types and even other AC-DC converter types could be used as appropriate for a given application.

The flyback enable signal output from comparator 404 may also be delivered to controller 408 of active capacitor bank/boost cell 440. The signal may be delivered via an optocoupler to provide galvanic isolation between input and output sides of the converter. Controller 408 may include a switch 410 that alternately couples the input of the controller's error amplifier to a voltage mode control input A and a current mode control input B. When the flyback converter is enabled (because the instantaneous value of the rectified input voltage Vrect is above the Vmode threshold), the error amplifier may be coupled to the current mode control loop. This can cause controller 408 to operate the switches of active capacitor bank/boost cell 440 as a current regulated boost converter, boosting the output voltage Vout of the converter to store energy in the energy storage capacitor CB. When the flyback converter is disabled (because the instantaneous value of the rectified input voltage Vrect is below the Vmode threshold), the error amplifier may be coupled to the voltage mode control loop. This can cause controller 408 to operate the switches of active capacitor bank/boost cell 440 as a voltage regulated buck converter, delivering energy stored in energy storage capacitor CB to the output of the converter, thereby maintaining regulation of the converter output voltage Vout. When the flyback converter is enabled (because the instantaneous value of the rectified input voltage Vrect is above the Vmode threshold), the error amplifier may be coupled to the current mode control loop. This can cause controller 408 to operate the switches of active capacitor bank/boost cell 440 as a current regulated boost converter, boosting the output voltage Vout of the converter to store energy in the energy storage capacitor CB.

Figure 5:
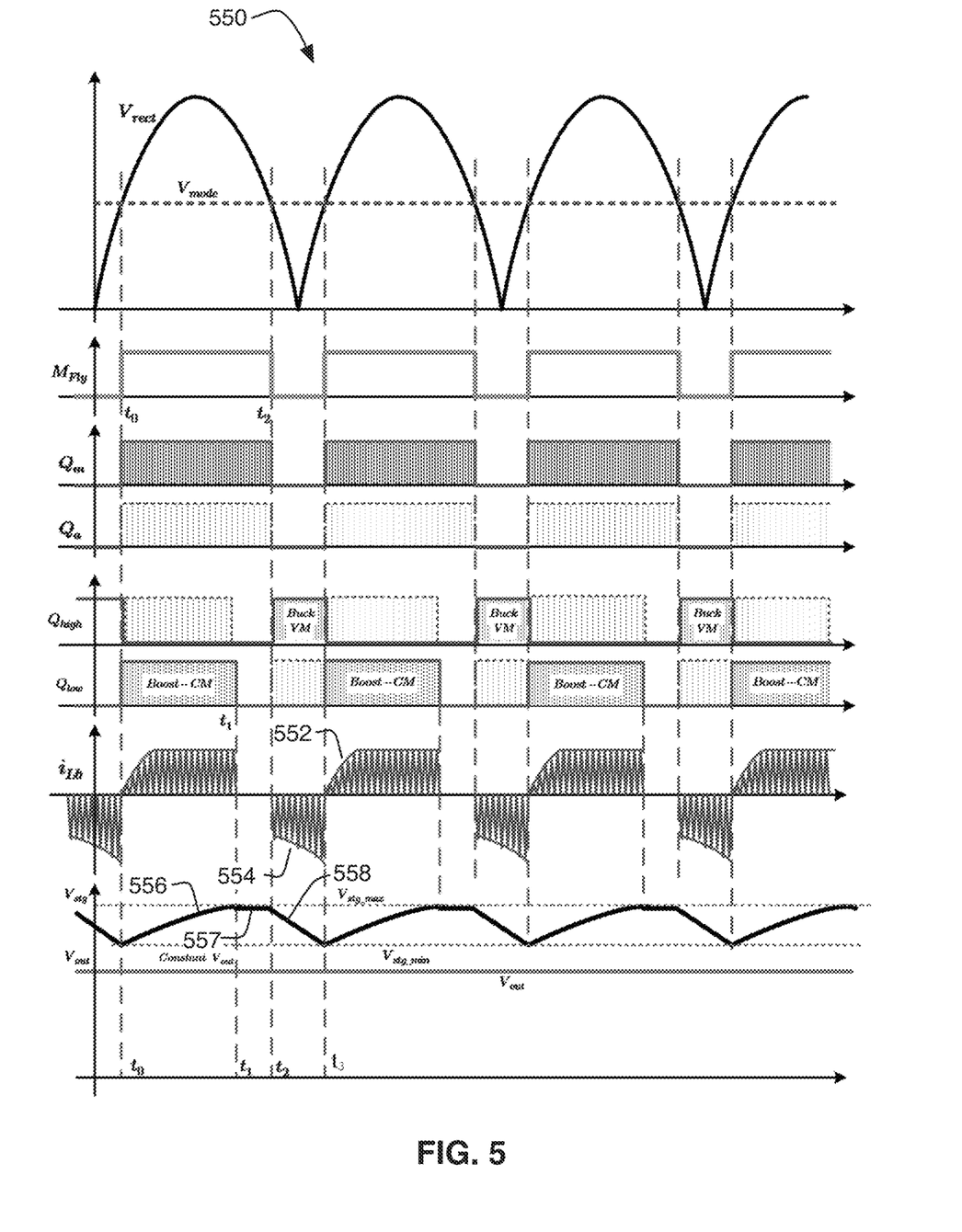
FIG. 5 illustrates various waveforms associated with the boost cell active capacitor bank embodiments described with reference to FIGS. 3A-3C.

FIG. 5 illustrates a plot 550 of various waveforms associated with the boost cell active capacitor bank embodiments discussed above. Waveform Vrect is the full wave rectified AC input voltage. Superimposed thereon is the mode selection voltage Vmode. Together these voltages determine whether the main AC-DC converter stage (e.g., the flyback converter) is enabled and the boost cell active capacitor bank is storing energy in its capacitor or whether the main AC-DC converter stage is disabled and the boost cell active capacitor bank is delivering energy from its capacitor. From time period t0 to t2, the instantaneous value of Vrect is greater than the threshold Vmode, and thus the main AC-DC converter stage should be enabled and the boost cell active capacitor bank should be operated to store energy in the energy storage capacitor CB, which is illustrated by the various waveforms illustrated below Vrect and Vmode.

Waveform Mfly is the flyback converter enable signal output from comparator 404, discussed above. When this signal is high, the flyback converter controller is enabled and the flyback converter is operated as described above to deliver energy from the AC input to the output. This is accomplished alternately operating the main switch of the flyback converter Qm, with variations in frequency and/or duty cycle being used to regulate the output voltage Vout. This is represented by the Qm waveform, which shows the switch as enabled and alternately switching during the t0 to t2 time interval.

The Qhigh and Qlow waveforms represent the driving of the Qhigh and Qlow switches of the boost cell active capacitor bank. During the t0 to t1 time interval, the boost cell active capacitor bank is operated as a boost converter to boost the output voltage Vout thereby storing energy in the energy storage capacitor CB. Time t1 may be before t2 and may be the time at which the maximum energy storage level in the boost cell active capacitor bank is reached. To achieve this mode of operation, switch Qhigh is disabled or switched complementarily to Qlow and switch Qlow is switched with duty cycle control using current mode control as a boost converter. As a result, Qlow becomes the switch of a boost converter, and Qhigh acts as the synchronous rectifier or diode of a boost converter, with inductor Lb serving as the boost element, and capacitor CB as output load.

The boost converter may be operated using current mode control, with an optional soft start current limiting operation. Thus, during the boost interval, the average boost inductor current may be ramped from zero to a predetermined maximum value as illustrated by curve segment 552. During this same interval, the voltage across the energy storage capacitor CB (i.e., Vstg) may increase from a minimum value (Vstg_min) to a maximum value (Vstg_max), as illustrated by curve segment 556. The minimum value may be determined by the amount of energy pulled from energy storage capacitor CB during the previous operating cycle. The maximum value may be a predetermined threshold determined by the controller 408 of boost cell/active capacitor bank 440, e.g., by comparator 412, which may compare the voltage across the energy storage capacitor CB to the threshold and disable boost cell switching when the maximum value is reached.

Following time t1, the main converter stage of the AC-DC converter (e.g., the flyback stage) may remain in operation, but switching of the boost cell/active capacitor bank may be disabled, as illustrated by the low state of Qhigh and Qlow in the t1-t2 time interval. Additionally, during this interval, the voltage across energy storage capacitor CB (Vstg) will remain constant at Vstg_max, as illustrated by curve segment 557. Finally, throughout all of this, the output voltage of the converter has remained constant at Vout, and the voltage across energy storage capacitor CB has at all time been greater than this output voltage.

From time period t2 to t3, the instantaneous value of Vrect is less than the threshold Vmode, and thus the main AC-DC converter stage should be disabled and the boost cell active capacitor bank should be operated to deliver energy from the energy storage capacitor CB, which is illustrated by the various waveforms illustrated below Vrect and Vmode.

Waveform Mfly is the flyback converter enable signal output from comparator 404, discussed above. When this signal is low, the flyback converter is disabled, and no energy is delivered from the AC input to the output. This is accomplished by disabling the main switch of the flyback converter Qm. This is represented by the Qm waveform, which shows the switch as disabled during the t2 to t3 time interval.

The Qhigh and Qlow waveforms represent the driving of the Qhigh and Qlow switches of the boost cell active capacitor bank. During the t2 to t3 time interval, the boost cell active capacitor bank is operated as a buck converter to buck the capacitor voltage Vstg to the output voltage Vout, thereby delivering energy from the energy storage capacitor CB to the output. To achieve this mode of operation, switch Qlow is disabled or switched complementarily to Qhigh and switch Qhigh is switched with duty cycle control using voltage mode control as a buck converter to produce the output voltage Vout. As a result, Qhigh becomes the switch of a buck converter, and Qlow acts as the synchronous rectifier or diode of a buck converter, with inductor Lb serving as the buck element, and capacitor CB as the input.

The buck converter may be operated using voltage mode control to produce the output voltage. During this same interval, the voltage across the energy storage capacitor CB (i.e., Vstg) may decrease from a maximum value (Vstg_max) to a minimum value (Vstg_min), as illustrated by curve segment 558. The minimum value may be determined by the load on the converter, with the maximum being a predetermined threshold determined by the controller 408 of boost cell/active capacitor bank 440 as discussed above. Additionally, as illustrated by boost inductor current curve iLB, and particularly segment 554 of that curve, as the voltage across the energy storage capacitor CB decreases (due to its discharge into the converter output), the current will need to increase to meet the demands of the load. Finally, throughout all of this, the output voltage of the converter has remained constant at Vout, and the voltage across energy storage capacitor CB has at all time been greater than this output voltage.

Figure 6A:
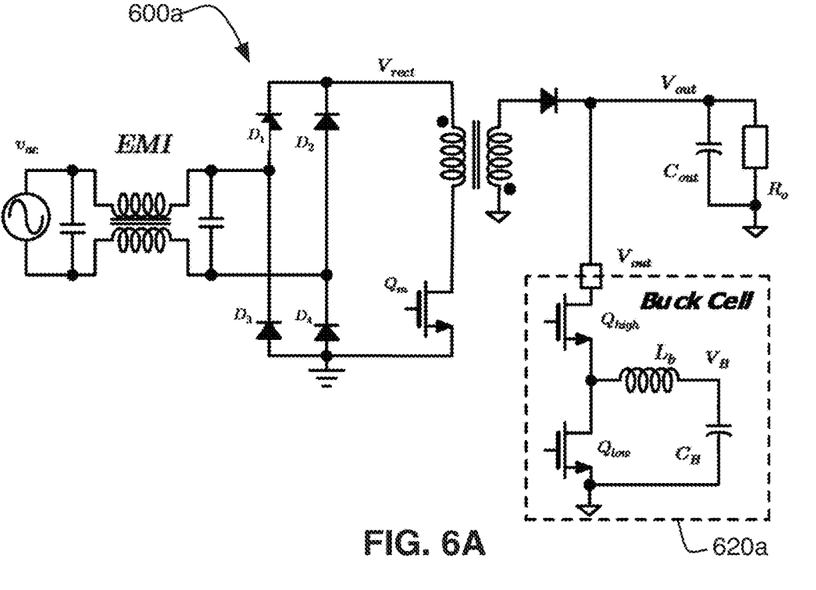
FIGS. 6A-6C illustrate AC-DC converters incorporating buck active capacitor banks.
Figure 6B:
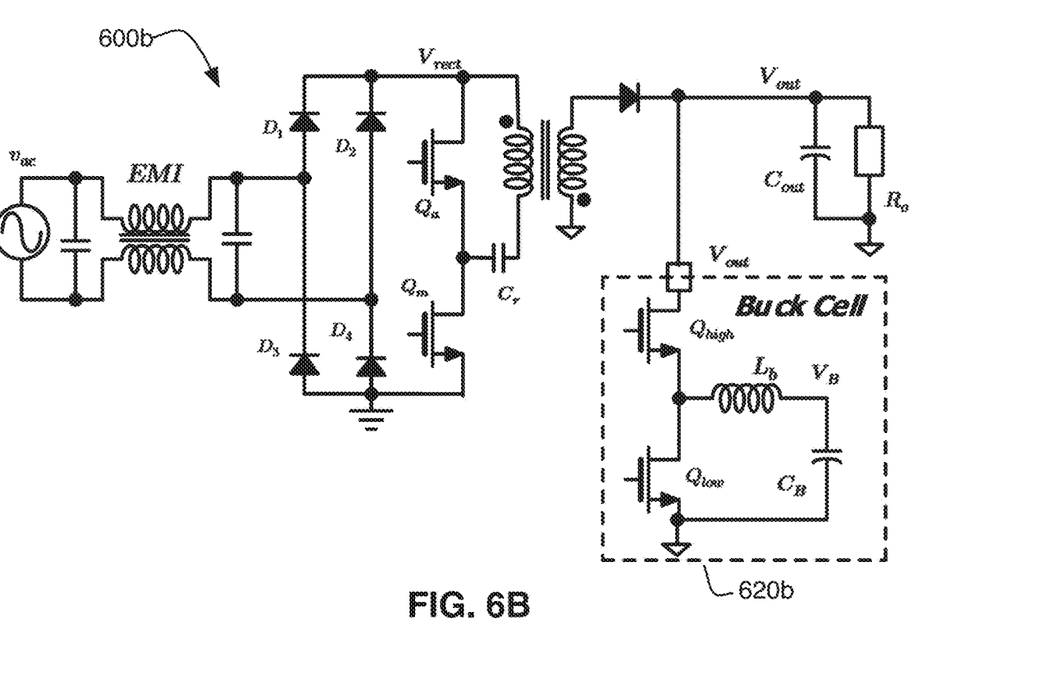
Figure 6C:
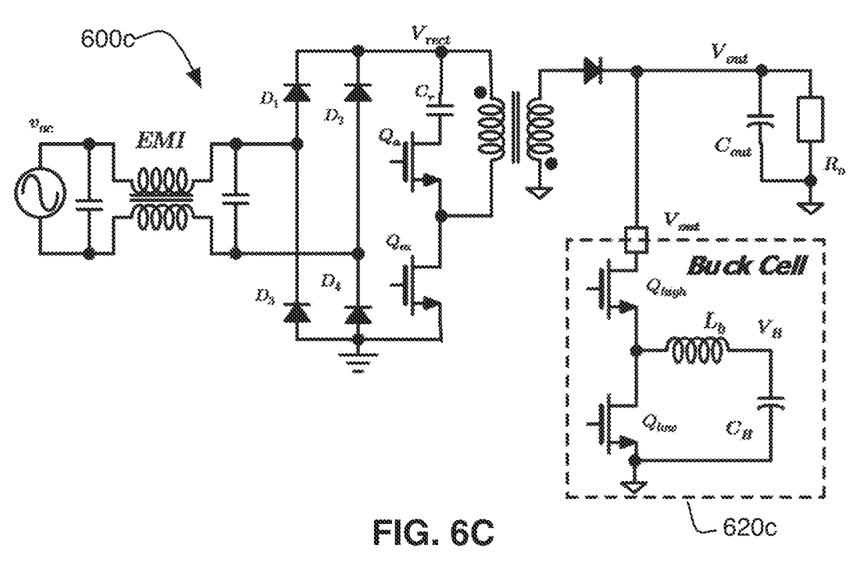

FIGS. 6A-6C illustrate AC-DC converters 600a-600c incorporating buck cells 620a-620c. FIG. 6A illustrates a conventional flyback converter 600a incorporating a buck cell 620a coupled to its output. Flyback converter 600a may operate substantially as described above with respect to FIGS. 1 and 2. Namely, when the rectified AC input voltage Vrect is high enough, flyback switch Qm may be alternately operated to store energy in the flyback transformer and deliver energy to the output. During this mode of operation, the switches of buck cell 620a may be operated as a buck converter to store energy in energy storage capacitor CB, which (by virtue of the buck operation) has a voltage less than the output voltage. Conversely, when the rectified AC input voltage Vrect is not high enough, the flyback converter may be disabled. During this mode of operation, the switches of buck cell 620a may be operated as a boost converter to boost the voltage across energy storage capacitor CB to the output voltage, thereby delivering energy from energy storage capacitor CB to the output. Presence of the active capacitor bank/buck cell 620a allows for elimination of the DC bulk capacitor on the input side of the flyback converter. Further details of this operation are described below with reference to FIG. 7.

FIG. 6B illustrates a primary resonant flyback converter 600b incorporating a buck cell 620b coupled to its output. Primary resonant flyback converter includes main switch Qm, generally corresponding to flyback switch Qm discussed above. The primary resonant flyback converter also includes a resonant capacitor Cr and an auxiliary switch Qa. Auxiliary switch Qa may be operated essentially complementarily with respect to main switch Qm, such that when Qm is closed, Qa is opened and vice versa. This switching combined with associated resonance between resonant capacitor Cr and the primary winding of the flyback transformer can provide for enhanced operation of the flyback converter by facilitating zero voltage switching and otherwise increasing efficiency.

Otherwise, flyback converter 620b may operate generally as described above with respect to FIGS. 1, 2, and 6A. Namely, when the rectified AC input voltage Vrect is high enough, flyback switch Qm may be alternately operated to store energy in the flyback transformer and deliver energy to the output. During this mode of operation, the switches of buck cell 620b may be operated as a buck converter to store energy in energy storage capacitor CB, which (by virtue of the buck operation) has a voltage greater than the output voltage. Conversely, when the rectified AC input voltage Vrect is not high enough, the flyback converter may be disabled. During this mode of operation, the switches of buck cell 620b may be operated as a boost converter to boost the voltage across energy storage capacitor CB to the output voltage, thereby delivering energy from energy storage capacitor CB to the output. Presence of the active capacitor bank/buck cell 640b allows for elimination of the DC bulk capacitor on the input side of the flyback converter. Further details of this operation are described below with reference to FIG. 7.

FIG. 6C illustrates a flyback converter 600c with a resonant active clamp incorporating a buck cell 620c coupled to its output. The active clamp resonant flyback converter includes main switch Qm, generally corresponding to flyback switch Qf discussed above. The active clamp resonant flyback converter also includes a clamp capacitor Cr and an auxiliary switch Qa. Auxiliary switch Qa may be operated essentially complementarily with respect to main switch Qm, such that when Qm is closed, Qa is opened and vice versa. This switching can allow leakage energy stored in the flyback transformer that would otherwise be lost to be recovered and reused.

Otherwise, flyback converter 620c may operate generally as described above with respect to FIGS. 1, 2, 6A, and 6B. Namely, when the rectified AC input voltage Vrect is high enough, flyback switch Qm may be alternately operated to store energy in the flyback transformer and deliver energy to the output. During this mode of operation, the switches of buck cell 620c may be operated as a buck converter to store energy in energy storage capacitor CB, which, by virtue of the buck operation, has a voltage less than the output voltage. Conversely, when the rectified AC input voltage Vrect is not high enough, the flyback converter may be disabled. During this mode of operation, the switches of buck cell 620c may be operated as a boost converter to boost the voltage across energy storage capacitor CB to the output voltage, thereby delivering energy from energy storage capacitor CB to the output. Presence of the active capacitor bank/buck cell 620c allows for elimination of the DC bulk capacitor on the input side of the flyback converter. Further details of this operation are described below with reference to FIG. 7.

Figure 7:
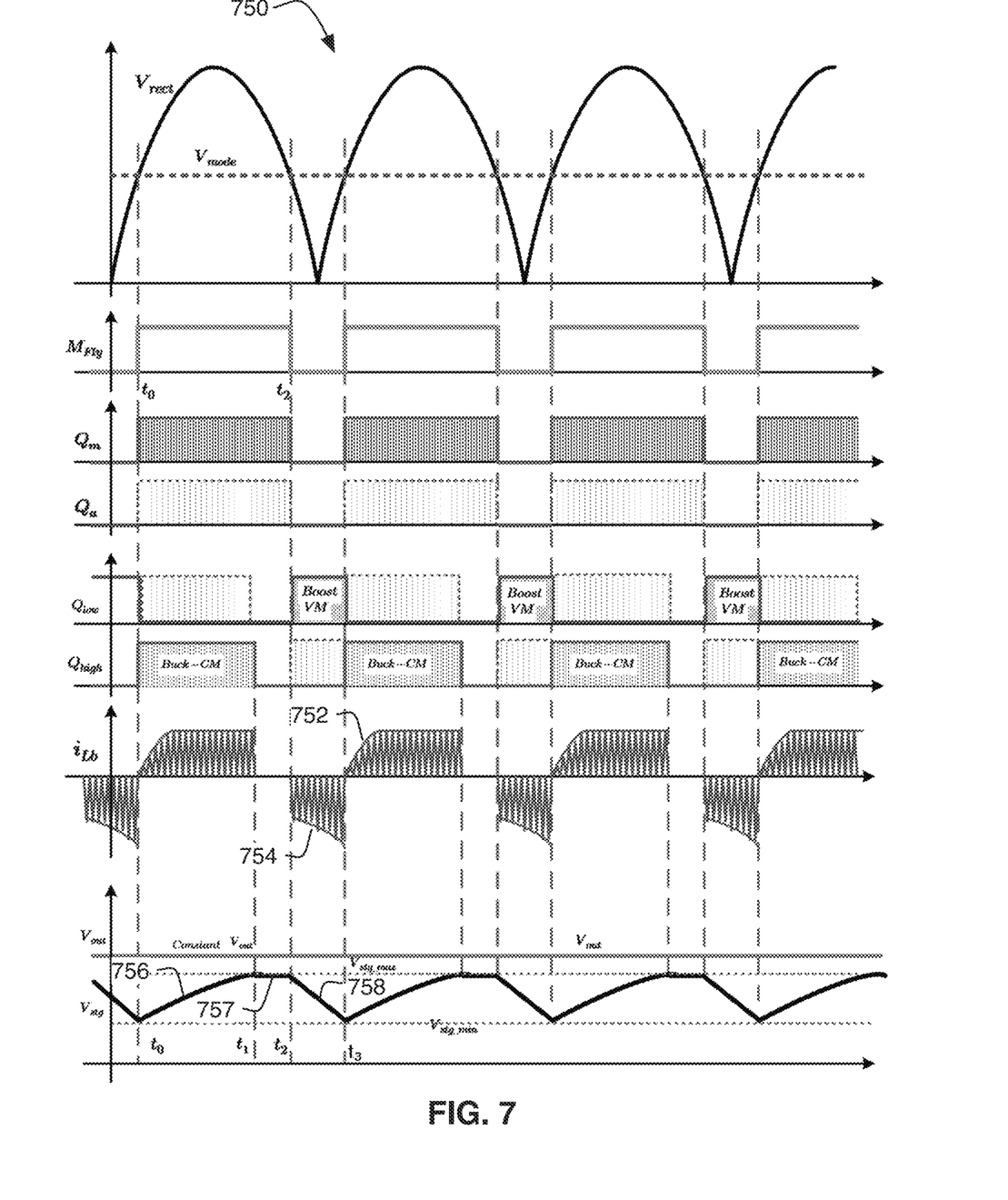
FIG. 7 illustrates various waveforms associated with the buck cell active capacitor bank embodiments described with reference to FIGS. 6A-6C.

FIG. 7 illustrates a plot 750 of various waveforms associated with the buck cell active capacitor bank embodiments discussed above. Waveform Vrect is the full wave rectified AC input voltage. Superimposed thereon is the mode selection voltage Vmode. Together these voltages determine whether the main AC-DC converter stage (e.g., the flyback converter) is enabled and the buck cell active capacitor bank is storing energy in its capacitor or whether the main AC-DC converter stage is disabled and the buck cell active capacitor bank is delivering energy from its capacitor. From time period t0 to t2, the instantaneous value of Vrect is greater than the threshold Vmode, and thus the main AC-DC converter stage should be enabled and the buck cell active capacitor bank should be operated to store energy in the energy storage capacitor CB, which is illustrated by the various waveforms illustrated below Vrect and Vmode.

Waveform Mfly is the flyback converter enable signal output from comparator 404, discussed above. (Although FIG. 4 depicts a boost cell active capacitor bank, operation of this portion of the control system is substantially the same for a buck cell.). When this signal is high, the flyback converter controller is enabled and the flyback converter is operated as described above to deliver energy from the AC input to the output. This is accomplished alternately operating the main switch of the flyback converter Qm, with variations in frequency and/or duty cycle being used to regulate the output voltage Vout. This is represented by the Qm waveform, which shows the switch as enabled and alternately switching during the t0 to t2 time interval.

The Qhigh and Qlow waveforms represent the driving of the Qhigh and Qlow switches of the buck cell active capacitor bank. During the t0 to t1 time interval, the buck cell active capacitor bank is operated as a buck converter to buck the output voltage Vout thereby storing energy in the energy storage capacitor CB. Time t1 may be before t2 and may be the time at which the maximum energy storage level in the buck cell active capacitor bank is reached. To achieve this mode of operation, switch Qlow is disabled or switched complementarily to Qhigh, and switch Qhigh is switched with duty cycle control using current mode control as a buck converter. As a result, Qhigh becomes the main duty cycle controlled switch of a buck converter, and Qlow acts as the synchronous rectifier or diode of a buck converter, with inductor Lb serving as the buck element, and capacitor CB as output load.

The buck converter may be operated using current mode control, with an optional soft start current limit. Thus, during the buck interval, the average buck inductor current may be ramped from zero to a predetermined maximum value as illustrated by curve segment 752. During this same interval, the voltage across the energy storage capacitor CB (i.e., Vstg) may increase from a minimum value (Vstg_min) to a maximum value (Vstg_max), as illustrated by curve segment 756. The minimum value may be determined by the amount of energy pulled from energy storage capacitor CB during the previous operating cycle. The maximum value may be a predetermined threshold determined by the controller 408 of buck cell/active capacitor bank 440, e.g., by comparator 412, which may compare the voltage across the energy storage capacitor CB to the threshold and disable boost cell switching when the maximum value is reached. (Although FIG. 4 depicts a boost cell active capacitor bank, operation of this portion of the control system is substantially the same for a buck cell.)

Following time t1, the main converter stage of the AC-DC converter (e.g., the flyback stage) may remain in operation, but switching of the buck cell/active capacitor bank may be disabled, as illustrated by the low state of Qhigh and Qlow in the t1-t2 time interval. Additionally, during this interval, the voltage across energy storage capacitor CB (Vstg) will remain constant at Vstg_max, as illustrated by curve segment 757. Finally, throughout all of this, the output voltage of the converter has remained constant at Vout, and the voltage across energy storage capacitor CB has at all time been less than this output voltage.

From time period t2 to t3, the instantaneous value of Vrect is less than the threshold Vmode, and thus the main AC-DC converter stage should be disabled and the buck cell active capacitor bank should be operated to deliver energy from the energy storage capacitor CB, which is illustrated by the various waveforms illustrated below Vrect and Vmode.

Waveform Mfly is the flyback converter enable signal output from comparator 404, discussed above. (Although FIG. 4 depicts a boost cell active capacitor bank, operation of this portion of the control system is substantially the same for a buck cell.) When this signal is low, the flyback converter is disabled, and no energy is delivered from the AC input to the output. This is accomplished by disabling the main switch of the flyback converter Qm. This is represented by the Qf waveform, which shows the switch as disabled during the t2 to t3 time interval.

The Qhigh and Qlow waveforms represent the driving of the Qhigh and Qlow switches of the buck cell active capacitor bank. During the t2 to t3 time interval, the buck cell active capacitor bank is operated as a boost converter to boost the capacitor voltage Vstg to the output voltage Vout, thereby delivering energy from the energy storage capacitor CB to the output. To achieve this mode of operation, switch Qhigh is disabled or switched complementarily to Qlow and switch Qlow is switched with duty cycle control using voltage mode control as a boost converter to produce the output voltage Vout. As a result, Qlow becomes the main duty cycle controlled switch of a buck converter, and Qhigh acts as the synchronous rectifier or diode of a boost converter, with inductor Lb serving as the boost element, and capacitor CB as the input.

The boost converter may be operated using voltage mode control to produce the output voltage. During this same interval, the voltage across the energy storage capacitor CB (i.e., Vstg) may decrease from a maximum value (Vstg_max) to a minimum value (Vstg_min), as illustrated by curve segment 758. The minimum value may be determined by the load on the converter, with the maximum being a predetermined threshold determined by the controller 408 of boost cell/active capacitor bank 440 as discussed above. (Although FIG. 4 depicts a boost cell active capacitor bank, operation of this portion of the control system is substantially the same for a buck cell.) Additionally, as illustrated by boost inductor current curve iLB, and particularly segment 754 of that curve, as the voltage across the energy storage capacitor CB decreases (due to its discharge into the converter output), the current will need to increase to meet the demands of the load. Finally, throughout all of this, the output voltage of the converter has remained constant at Vout, and the voltage across energy storage capacitor CB has at all time been less than this output voltage.

Figure 8:
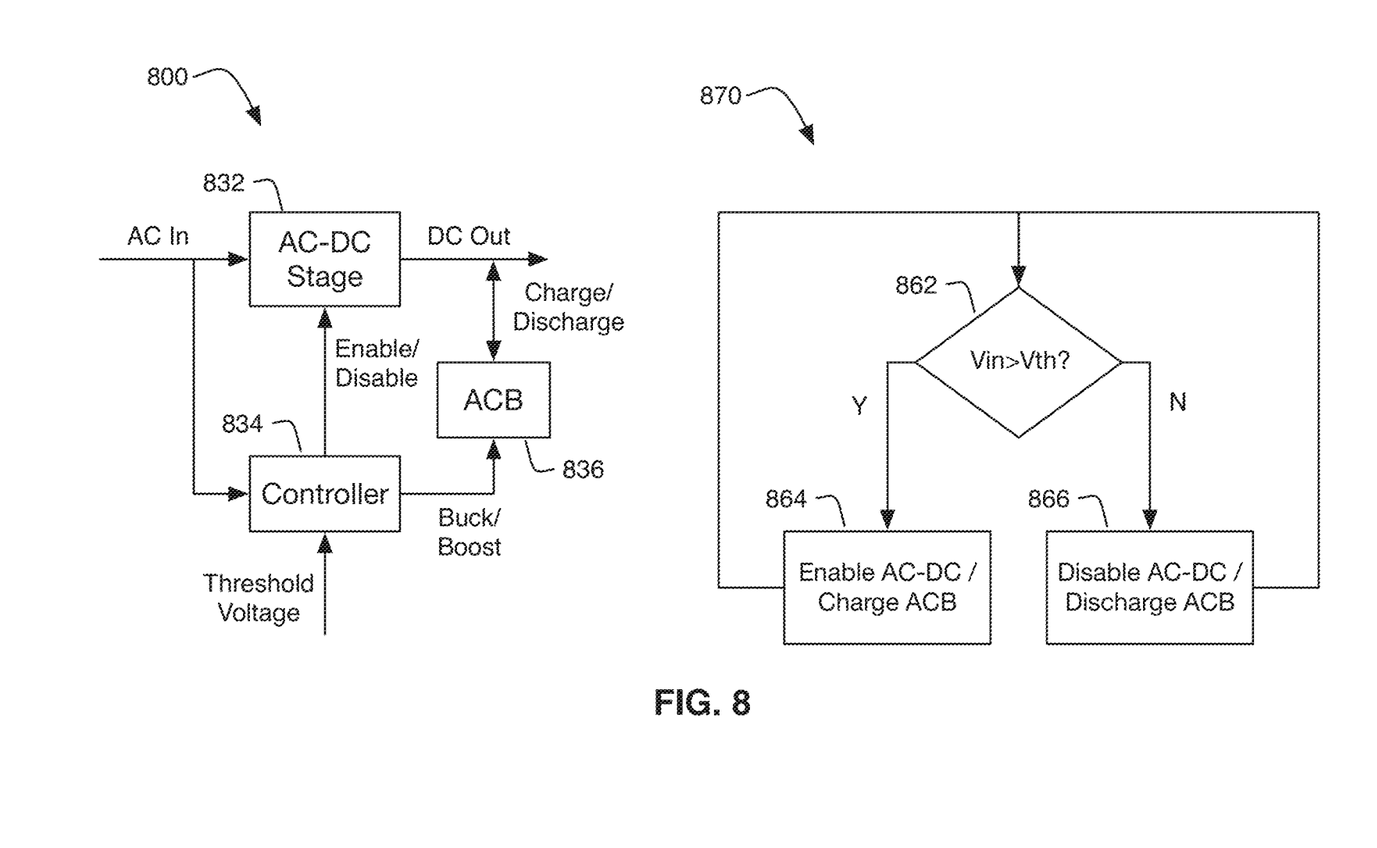
FIG. 8 illustrates a generalized block diagram of an AC-DC converter with an active capacitor bank and a flowchart depicting operation of such a converter.

FIG. 8 illustrates a generalized block diagram 800 of an AC-DC converter as described herein and a flowchart 870 depicting operation of such a converter. With reference to block diagram 800, the converter 800 can include an AC-DC converter stage 832. AC-DC converter stage may be a flyback converter, such as one of the flyback converter configurations described above. Alternatively, the AC-DC stage may be any other AC-DC converter type that is suitable for a given application. This AC-DC converter stage may receive an AC input voltage and deliver a DC output voltage. An active capacitor bank 836 may be coupled to the DC output of AC-DC stage 832. As described above, the active capacitor bank 836 may be configured as a boost cell or as a buck cell. A controller 834 may be coupled to both AC-DC stage 832 and active capacitor bank 836.

Controller 834 may be configured to compare the input AC voltage (for example, the rectified AC input voltage) to a threshold voltage and, in response thereto, selectively enable or disable AC-DC stage 832 and cause active capacitor bank 836 to operate in a buck or boost mode (depending on the converter topology) to charge the active capacitor bank from the DC output or discharge the active capacitor bank into the DC output. More specifically, as depicted in flowchart 870, controller 834 may compare the input voltage Vin (e.g., the rectified AC input voltage) to a mode selection threshold voltage Vth (block 862). If the input voltage is above the mode selection threshold, then the controller may enable AC-DC stage 832 and cause active capacitor bank 836 to charge from the DC output voltage. In the case of a boost cell active capacitor bank, this can include operating the switching devices of the active capacitor bank as a boost converter to store energy in one or more capacitors of the active capacitor bank. Conversely, in the case of a buck cell active capacitor bank, this can include operating the switching devices of the active capacitor bank as a buck converter to store energy in one or more capacitors of the active capacitor bank. Alternatively, if the input voltage is below the mode selection threshold, then the controller may disable AC-DC stage 832 and cause active capacitor bank 836 to discharge its capacitor(s) into the DC output, thereby maintaining output voltage regulation. In the case of a boost cell active capacitor bank, this can include operating the switching devices of the active capacitor bank as a buck converter to discharge energy from one or more capacitors of the active capacitor bank. Conversely, in the case of a buck cell active capacitor bank, this can include operating the switching devices of the active capacitor bank as a boost converter to discharge energy from one or more capacitors of the active capacitor bank into the DC output, thereby maintaining output voltage regulation.

The foregoing describes exemplary embodiments of AC-DC converters that include active capacitor banks coupled to their output, thereby allowing a reduction in size or elimination of the DC bus bulk capacitor typically found in AC-DC converters. Such systems may be used in a variety of applications but may be particularly advantageous when used in conjunction with mains adapters for personal electronic devices such as mobile computing devices (e.g., laptop computers, tablet computers, smart phones, and the like) and their accessories (e.g., wireless earphones, styluses and other input devices, etc.) as well as wireless charging accessories (e.g., charging mats, pads, stands, etc.) Although numerous specific features and various embodiments have been described, it is to be understood that, unless otherwise noted as being mutually exclusive, the various features and embodiments may be combined various permutations in a particular implementation. Thus, the various embodiments described above are provided by way of illustration only and should not be constructed to limit the scope of the disclosure. Various modifications and changes can be made to the principles and embodiments herein without departing from the scope of the disclosure and without departing from the scope of the claims.

The invention claimed is:

1. An AC-DC converter comprising:
   an AC-DC converter stage having an input configured to receive an AC input voltage and an output configured to deliver a DC output voltage;
   an active capacitor bank coupled to the output of the AC-DC converter stage; and
   a controller coupled to the AC-DC converter stage and the active capacitor bank, wherein the controller compares the AC input voltage to a threshold voltage and:
   responsive to the AC input voltage being greater than the threshold voltage, the controller enables the AC-DC converter stage and operates the active capacitor bank to charge from the output of the AC-DC converter stage; and
   responsive to the AC input voltage being less than the threshold voltage, the controller disables the AC-DC converter stage and operates the active capacitor bank to discharge into the output of the AC-DC converter stage.

2. The AC-DC converter of claim 1 wherein the active capacitor bank is a buck cell.

3. The AC-DC converter of claim 2 wherein the buck cell comprises:
   a high side switch and a low side switch coupled in series between the output of the AC-DC converter stage and ground; and
   an inductor coupled between a junction of the high side and low side switches and an energy storage capacitor.

4. The AC-DC converter of claim 3 wherein the controller operates the active capacitor bank to charge from the output of the AC-DC converter stage by operating the high side switch and low side switch as a buck converter to buck the output voltage for storage in the energy storage capacitor.

5. The AC-DC converter of claim 3 wherein the controller operates the active capacitor bank to discharge into the output of the AC-DC converter stage by operating the high side switch and the low side switch as a boost converter to boost the energy storage capacitor voltage for energy delivery to the output of the AC-DC converter stage.

6. The AC-DC converter of claim 1 wherein the active capacitor bank is a boost cell.

7. The AC-DC converter of claim 6 wherein the boost cell comprises:
   an inductor and a low side switch coupled in series between the output of the AC-DC converter stage and ground; and
   a high side switch coupled between a junction of the inductor and the low side switch and an energy storage capacitor.

8. The AC-DC converter of claim 7 wherein the controller operates the active capacitor bank to charge from the output of the AC-DC converter stage by operating the high side switch and low side switch as a boost converter to boost the output voltage for storage in the energy storage capacitor.

9. The AC-DC converter of claim 7 wherein the controller operates the active capacitor bank to discharge into the output of the AC-DC converter stage by operating the high side switch and the low side switch as a buck converter to buck the energy storage capacitor voltage for energy delivery to the output of the AC-DC converter stage.

10. The AC-DC converter of claim 1 wherein the AC-DC converter stage is a flyback converter.

11. The AC-DC converter of claim 10 wherein the flyback converter is a primary resonant flyback converter.

12. The AC-DC converter of claim 10 wherein the flyback converter is an active clamp flyback converter.

13. The AC-DC converter of claim 1 wherein the controller operates the active capacitor bank to charge from the output of the AC-DC converter stage by current mode control of one or more switches of the active capacitor bank.

14. The AC-DC converter of claim 13 wherein the current mode control includes a current limiting soft start.

15. The AC-DC converter of claim 1 wherein the controller operates the active capacitor bank to discharge into the output of the AC-DC converter stage by voltage mode control of one or more switches of the active capacitor bank.

16. A method of controlling a power converter having an AC-DC converter stage and an active capacitor bank coupled to an output of the AC-DC converter stage, the method comprising:
   comparing an input voltage of the AC-DC converter to a mode selection threshold voltage,
      responsive to the AC input voltage being greater than the threshold voltage, enabling the AC-DC converter stage and operating the active capacitor bank to charge from the output of the AC-DC converter stage; and
      responsive to the AC input voltage being less than the threshold voltage, disabling the AC-DC converter stage and operating the active capacitor bank to discharge into the output of the AC-DC converter stage.

17. The method of claim 16 wherein:
   operating the active capacitor bank to charge from the output of the AC-DC converter stage comprises operating one or more switches of the active capacitor bank as a buck converter to store energy from the output of the AC-DC converter in an energy storage capacitor; and
   operating the active capacitor bank to discharge into the output of the AC-DC converter stage comprises operating one or more switches of the active capacitor bank as a boost converter to boost the energy storage capacitor voltage for energy delivery to the output of the AC-DC converter stage.

18. The method of claim 16 wherein:
   operating the active capacitor bank to charge from the output of the AC-DC converter stage comprises operating one or more switches of the active capacitor bank as a boost converter to store energy from the output of the AC-DC converter in an energy storage capacitor; and
   operating the active capacitor bank to discharge into the output of the AC-DC converter stage comprises operating one or more switches of the active capacitor bank as a buck converter to buck the energy storage capacitor voltage for energy delivery to the output of the AC-DC converter stage.

19. The method of claim 16 wherein:
   operating the active capacitor bank to charge from the output of the AC-DC converter stage comprises current mode control of one or more switches of the active capacitor bank; and
   operating the active capacitor bank to discharge into the output of the AC-DC converter stage comprises voltage mode control of one or more switches of the active capacitor bank.

20. The method of claim 19 wherein the current mode control includes a soft start current limit.

21. A power converter comprising:
   a flyback converter configured to receive an AC input voltage and deliver a DC output voltage;
   an active capacitor bank coupled to the output of the flyback converter, the active capacitor bank including an energy storage capacitor and a plurality of switching devices operable as a bidirectional converter to alternately charge the energy storage capacitor from the DC output voltage or discharge the energy storage capacitor to maintain regulation of the DC output voltage; and
   control circuitry responsive to the AC input voltage that:
      enables the flyback converter and operates the plurality of switching devices to charge the energy storage capacitor from the DC output voltage responsive to the AC input voltage being greater than a threshold voltage; and
      disables the flyback converter and operates, the plurality of switching devices to discharge the energy storage capacitor to maintain regulation of the DC output voltage responsive to the AC input voltage being less than the threshold voltage.

* * * * *